United States Patent
Matsubara et al.

(10) Patent No.: US 10,859,635 B2
(45) Date of Patent: Dec. 8, 2020

(54) MANAGEMENT DEVICE AND POWER SUPPLY DEVICE

(71) Applicant: SANYO Electric Co., Ltd., Daito (JP)

(72) Inventors: Tomoyuki Matsubara, Hyogo (JP); Masaki Yugou, Hyogo (JP)

(73) Assignee: SANYO Electric Co., Ltd., Daito (JP)

(*) Notice: Subject to any disclaimer, the term of this patent is extended or adjusted under 35 U.S.C. 154(b) by 172 days.

(21) Appl. No.: 16/077,586

(22) PCT Filed: Feb. 20, 2017

(86) PCT No.: PCT/JP2017/006110
§ 371 (c)(1),
(2) Date: Aug. 13, 2018

(87) PCT Pub. No.: WO2017/159219
PCT Pub. Date: Sep. 21, 2017

(65) Prior Publication Data
US 2019/0056453 A1 Feb. 21, 2019

(30) Foreign Application Priority Data
Mar. 15, 2016 (JP) .................. 2016-050532

(51) Int. Cl.
*G01R 31/36* (2020.01)
*G01R 31/396* (2019.01)
(Continued)

(52) U.S. Cl.
CPC .......... *G01R 31/396* (2019.01); *B60L 58/12* (2019.02); *G01R 19/0084* (2013.01);
(Continued)

(58) Field of Classification Search
CPC .................. G01R 31/3835; G01R 31/396
See application file for complete search history.

(56) References Cited

U.S. PATENT DOCUMENTS 8,030,893 B2 * 10/2011 Nakatsuji .............. H02J 7/0016
320/116
2013/0026994 A1 1/2013 Morikawa
(Continued)

FOREIGN PATENT DOCUMENTS

JP 2011-50155 A 3/2011
JP 2012-172992 A 9/2012
(Continued)

OTHER PUBLICATIONS

International Search Report dated Apr. 11, 2017, issued in counterpart application No. PCT/JP2017/006110. (1 page).

*Primary Examiner* — Walter L Lindsay, Jr.
*Assistant Examiner* — Milton Gonzalez
(74) *Attorney, Agent, or Firm* — Westerman, Hattori, Daniels & Adrian, LLP (57) ABSTRACT

A first voltage detection circuit is connected by first voltage detection lines to each node in a plurality of cells connected in series and detects the voltage of each of the plurality of cells. A second voltage detection circuit is connected, by second voltage detection lines, to each node in the plurality of cells and detects the voltage of each of the plurality of cells. First capacitance elements are each connected between two first voltage detection lines connected to each cell. Second capacitance elements are each connected between two second voltage detection lines connected to each cell. A first charge drawing circuit draws charge from each node in the plurality of cells, via each first voltage detection line. A second charge drawing circuit draws charge from each node in the plurality of cells, via each second voltage detection line.

9 Claims, 10 Drawing Sheets

(51) Int. Cl.
*B60L 58/12* (2019.01)
*G01R 35/00* (2006.01)
*H01M 10/42* (2006.01)
*G01R 31/3835* (2019.01)
*H01M 10/48* (2006.01)
*G01R 19/00* (2006.01)
*H02J 7/00* (2006.01)
*G01R 31/50* (2020.01)
*B60K 6/28* (2007.10)

(52) U.S. Cl.
CPC ........ *G01R 31/3835* (2019.01); *G01R 35/00* (2013.01); *H01M 10/425* (2013.01); *H01M 10/482* (2013.01); *H02J 7/0021* (2013.01); *B60K 6/28* (2013.01); *B60Y 2200/91* (2013.01); *B60Y 2200/92* (2013.01); *G01R 31/50* (2020.01); *H01M 2010/4271* (2013.01); *H02J 7/0016* (2013.01)

(56) References Cited

U.S. PATENT DOCUMENTS

| | | |
|---|---|---|
| 2014/0015454 A1 | 1/2014 | Kunimitsu et al. |
| 2014/0152261 A1* | 6/2014 | Yamauchi ............ B60L 58/22 320/118 |
| 2015/0054519 A1* | 2/2015 | Tomonaga ........... G01R 31/396 324/434 |
| 2015/0077124 A1* | 3/2015 | Suzuki ................ H02J 7/0021 324/426 |
| 2018/0196105 A1* | 7/2018 | Inukai .................... G01R 35/00 |

FOREIGN PATENT DOCUMENTS

| | | |
|---|---|---|
| JP | 2013-29362 A | 2/2013 |
| WO | 2012/132178 A1 | 10/2012 |

* cited by examiner

MANAGEMENT DEVICE AND POWER SUPPLY DEVICE

TECHNICAL FIELD

The present invention relates to a management device for managing a state of a power storage module including batteries, and a power supply device including the management device.

BACKGROUND ART

In recent years, hybrid vehicles (HV), plug-in hybrid vehicles (PHV), and electric vehicles (EV) are being spread. Secondary batteries as a key device are installed in these vehicles. As secondary batteries for the vehicle, the nickel hydride batteries and the lithium ion batteries are spread. In the future, it is expected that spread of the lithium ion batteries having high energy density are accelerated.

Since the operable voltage range and the prohibited voltage range in the lithium ion batteries are close, the stricter voltage management is necessary in the lithium ion batteries than other types of batteries. When an assembled battery in which a plurality of the lithium ion battery cells are connected in series is used, a voltage detection circuit is provided for detecting each of the battery cells. Each of the battery cells and a voltage detection circuit are connected by voltage detection lines. The voltage detected in each of the battery cells is used for controlling of charge or discharge, equalization in the cell voltages, or the like.

The technology is known, that another voltage detection circuit is provided as a redundant circuit in order to determine the failure or trouble of the voltage detection circuit. When there is a difference more than a prescribed value between a voltage detected by the voltage detection circuit and a voltage detected by the redundant circuit, an occurrence of the failure or trouble is determined, to stop a vehicle. Relating to this technology, another technology described in Patent Literature 1 is also known.

CITATION LIST

Patent Literature

Patent Literature 1: International Patent Publication No. 2012/132178

SUMMARY OF THE INVENTION

In the conventional technology, the occurrence of the failure or trouble can be determined. However, it is difficult to determine whether or not the voltaae detection line is disconnected.

The present invention has been conceived in light of such circumstances, and an object thereof is to provide a technique capable of specifying the location of the disconnection as well as detecting the occurrence of the disconnection.

To solve the above-mentioned requirements, a management device of one aspect of the present invention, includes:

a first voltage detection circuit which is connected by first voltage detection lines to each node in a plurality of cells connected in series and detects the voltage of each of the plurality of cells;

a second voltage detection circuit which is connected, by second voltage detection lines, to each node in the plurality of cells and detects the voltage of each of the plurality of cells;

first capacitance elements which are each connected between the two first voltage detection lines connected to each cell;

second capacitance elements which are each connected between the two second voltage detection lines connected to each cell;

a first charge drawing circuit which draws charge from each node in the plurality of cells, via each first voltage detection line; and a second charge drawing circuit which draws charge from each node in the plurality of cells, via each second voltage detection line.

According to the present invention, it is capable to specify the location of the disconnection as well as to detect the occurrence of the disconnection.

DESCRIPTION OF EMBODIMENTS

First Exemplary Embodiment

Figure 1:
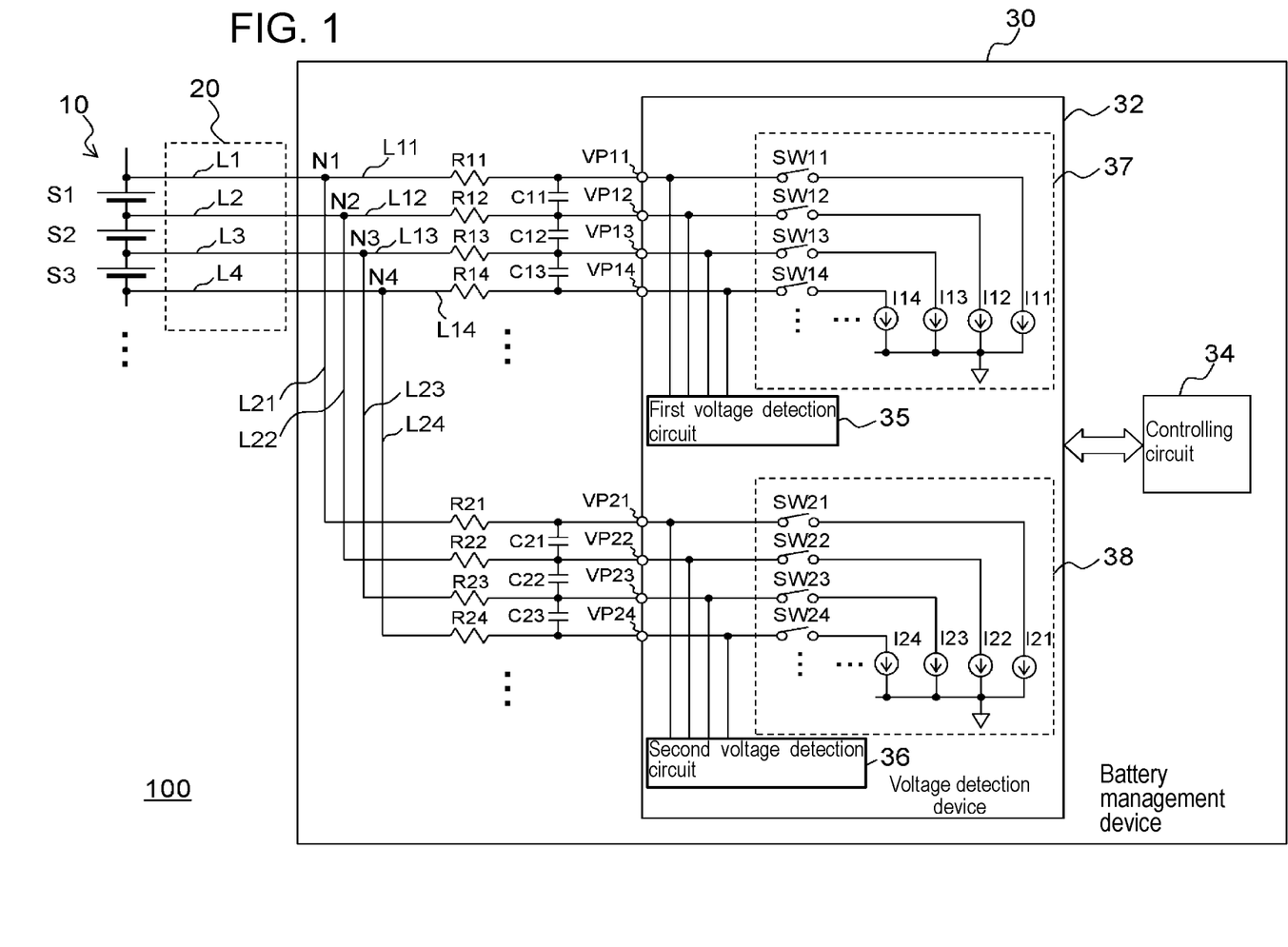
FIG. 1 is a circuit diagram showing a power supply device according to a first exemplary embodiment of the present invention.

FIG. 1 is a circuit diagram showing a configuration of power supply device 100 relating to a first exemplary embodiment. Power supply device 100 is installed inside the vehicle, as a driving power source for hybrid vehicles (HV), or electric vehicles (EV). Power supply device 100 is provided with assembled battery (power storage module) 10 and battery management device (management device) 30. Assembled battery 10 and battery management device 30 are connected by wire harness 20.

Assembled battery 10 has a plurality of battery cells (cells) connected in series. In this exemplary embodiment, three pieces of battery cells S1-S3 are explained. However, explanations of other battery cells are omitted, and such other battery cells are not shown in figures. Herein, it is assumed to use lithium ion batteries as the battery cells. Assembled battery 10 which is installed inside the hybrid vehicle or electric vehicle, mainly has 200V or more. The battery cells are often connected in 60 or more series. A load and a charging circuit (not shown in figures) are connected between both ends of assembled battery 10. Assembled batter 10 is discharged to the load, and is charged with the charging circuit.

Battery management device 30 includes a plurality of first capacitance elements C11-C13, a plurality of first resistors R11-R14, a plurality of second capacitance elements C21-C23, a plurality of second resistors R21-R24, voltage detection device 32, and controlling circuit 34. The configuration corresponding to battery cells S1-S3 is explained, also in battery management device 30. However, explanations and figures of configurations corresponding to other battery cells are omitted. Battery management device 30 manages assembled battery 10. Battery management device 30, for example, is provided on a printed wiring board.

The nodes in the plurality of battery cells S1-S3 are respectively connected to common nodes N1-N4 within battery management device 30, by common detection lines L1-L4. Common nodes N1-N4 are respectively connected to a plurality of first voltage input terminals VP11-VP14 of voltage detection device 32, by first voltage detection lines L11-L14. Common nodes N1-N4 are respectively connected to a plurality of second voltage input terminals VP21-VP24 of voltage detection device 32, by second voltage detection lines L21-L24. Thus, first voltage detection lines L11-L14 and second voltage detection lines L21-L24 are connected to the nodes in the plurality of battery cells S1-S3, by common detection lines L1-L4.

Common voltage detection lines L1-L4 are configured of, printed wirings inside battery management device 30, and wire harness 20 outside battery management device 30. First voltage detection lines L11-L14 and second voltage detection lines L21-L24 are configured of printed wirings.

Low pass filters are respectively provided at the plurality of first voltage detection lines L11-L14. The low pass filters suppress noises of first voltage detection lines L11-L14. In the example shown in FIG. 1, the low pass filter is configured of an RC circuit. Concretely, first resistors R11-R14 are respectively connected in series to first voltage detection lines L11-L14.

The plurality of first capacitance elements C11-C13 are respectively connected to between two of the first voltage detection lines which are respectively connected to battery cells S1-S3, at the voltage detection device 32 side nearer than first resistors R11-R14. Namely, first capacitance element C11 is connected to between first voltage detection line L11 and first voltage detection line L12, and first capacitance element C12 is connected to between first voltage detection line L12 and first voltage detection line L13, and first capacitance element C13 is connected to between first voltage detection line L13 and first voltage detection line L14. Thus, the plurality of first capacitance elements C11-C13 are respectively connected to between both ends of the corresponding battery cells.

Low pass filters are respectively provided at the plurality of second voltage detection lines L21-L24. The low pass filters suppress noises of second voltage detection lines L21-L24. Concretely, second resistors R21-R24 are respectively connected in series to second voltage detection lines L21-L24.

The plurality of second capacitance elements C21-C23 are respectively connected to between two of the second voltage detection lines which are respectively connected to battery cells S1-S3, at the voltage detection device 32 side nearer than second resistors R21-R24. Namely, first capacitance element C21 is connected to between second voltage detection line L21 and second voltage detection line L22, and second capacitance element C22 is connected to between second voltage detection line L22 and second voltage detection line L23, and second capacitance element C23 is connected to between second voltage detection line L23 and second voltage detection line L24. Thus, the plurality of second capacitance elements C21-C23 are respectively connected to between both ends of the corresponding battery cells.

Voltage detection device 32 detects respective voltages of the plurality of battery cells S1-S3. Each of detected voltages of battery cells S1-S3 is transmitted to controlling circuit 34. Voltage detection device 32 is configured of an ASIC (Application Specific Integrated Circuit) as the specific custom IC, or the like. Here, voltage detection device 32 is provided as one piece of a semiconductor integrated circuit.

Voltage detection device 32 includes first voltage detection circuit 35, second voltage detection circuit 36, first charge drawing circuit 37, and second charge drawing circuit 38.

First voltage detection circuit 35 is connected to first voltage input terminals VP11-VP14. Namely, first voltage detection circuit 35 is connected to each of the nodes of battery cells S1-S3 via common voltage detection lines L1-L4 and first voltage detection lines L11-L14, and detects each voltage of battery cells S1-S3.

Second voltage detection circuit 36 is connected to second voltage input terminals VP21-VP24. Namely, second voltage detection circuit 36 is connected to each of the nodes of battery cells S1-S3 via common voltage detection lines L1-L4 and second voltage detection lines L21-L24, and detects each voltage of battery cells S1-S3.

First charge drawing circuit 37 is connected to first voltage input terminals VP11-VP14, and draws charge from each node in the plurality of battery cells S1-S3, via each common voltage detection line L1-L4 and each first voltage detection line L11-L14.

First charge drawing circuit 37 includes a plurality of first switch elements SW11-SW14, and a plurality of first current sources I11-I14. One end of each of first switch elements SW11-SW14 is connected to the corresponding one of the first voltage input terminals.

First current sources I11-I14 which each have one end connected to the other end of the corresponding one of the first switch elements and the other end connected to a grounded potential (a predetermined fixed potential). Then, first current sources I11-I14 each draw a constant current from the corresponding first voltage detection line when the corresponding first switch element is in a conductive state.

Second charge drawing circuit 38 is connected to second voltage input terminals VP21-VP24, and draws charge from each node in the plurality of battery cells S1-S3, via each common voltage detection line L1-L4 and each second voltage detection line L21-L24.

Second charge drawing circuit 38 includes a plurality of second switch elements SW21-SW24, and a plurality of second current sources I21-I24. One end of each of second switch elements SW21-SW24 is connected to the corresponding one of the second voltage input terminals.

Second current sources I21-I24 which each have one end connected to the other end of the corresponding one of the second switch elements and the other end connected to the grounded potential. Then, second current sources I21-I24 each draw a constant current from the corresponding second voltage detection line when the corresponding second switch element is in a conductive state.

The magnitudes of the constant currents which first current sources I11-I14 and second current sources I21-I24 draw, are respectively, substantially equal. First switch elements SW11-5W14 and second switch elements SW21-SW24 are, for example, n-type MOS transistors.

Second capacitance elements C21-C23, second resistors R21-R24, second voltage detection circuit 36, and second charge drawing circuit 38, constitute a redundant circuit.

controlling circuit 34 controls first charge drawing circuit 37 and second charge drawing circuit 38, to detect a disconnection. Detecting the disconnection will be detailed later. Controlling circuit 34 caries out battery controlling of equalizing control of the cell voltages (hereinafter called a cell balance) or the like, referring to voltages obtained from first voltage detection circuit 35 and second voltage detection circuit 36. Further, controlling circuit 34 notifies a higher rank controller (not shown in the figures) of the obtained voltages. The higher rank controller carries out charge and discharge controlling of assembled battery 10, based on the notified voltages.

In addition, when controlling circuit 34 detects the abnormality of the voltages of battery cells S1-S3, controlling circuit 34 notifies a higher rank controller of an abnormal detection signal which shows the abnormality of the voltage. Further, when the higher rank controller is notified of the abnormal detection signal, the higher rank controller carries out a necessary countermeasure of stopping the charge and discharge of assembled battery 10 or the like. Concretely, in a case where any one of the voltages of battery cells S1-S3 is lower than first detection voltage UV or higher than second detection voltage OV, controlling circuit 34 outputs the abnormal detection signal. Second detection voltage OV is higher than first detection voltage UV. Controlling circuit 34 is configured of a CPU, a logic circuit, or their combination.

Next, detecting the disconnection in power supply device 100 will be described. Controlling circuit 34 makes first charge drawing circuit 37 and second charge drawing circuit 38 alternatively draw the charge. Concretely, controlling circuit 34 changes the switch state to the first state and the second state alternatively. The first state is a state where first switch elements SW11-5W14 are conductive and second switch elements SW21-SW24 are non-conductive. The second state is a state where first switch elements SW11-SW14 are non-conductive and second switch elements SW21-SW24 are conductive. Thus, controlling circuit 34 can always determine whether or not the disconnection occurs, while suppressing an increase of power consumption.

(1) Case 1 where the disconnection does not occur in first voltage detection lines L11-L14, second voltage detection lines L21-L24, and common voltage detection lines L1-L4

Figure 2:
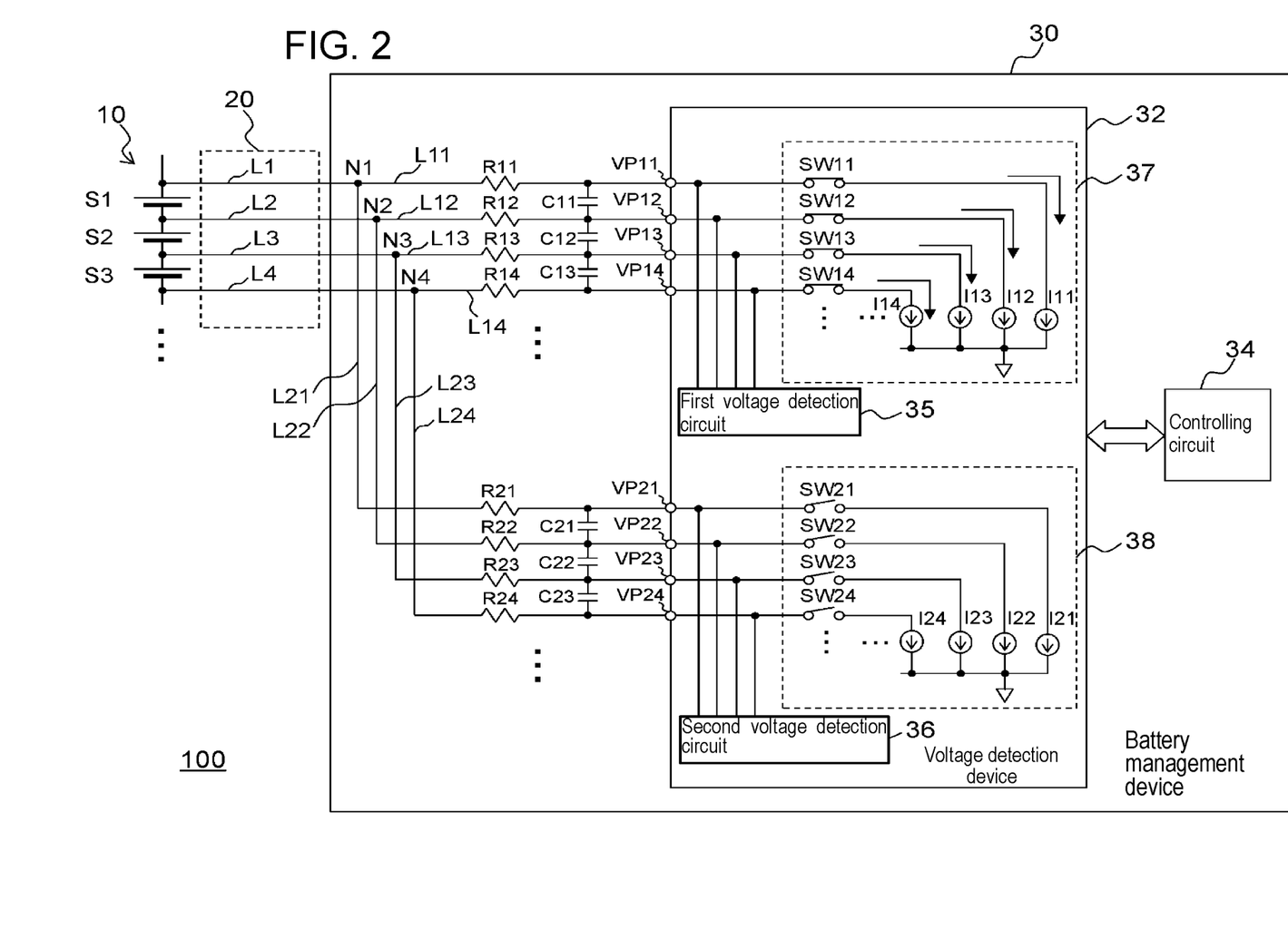
FIG. 2 is a figure illustrating the performance of the power supply device in FIG. 1 in a case where a disconnection does not occur.

FIG. 2 is a figure illustrating the performance of power supply device 100 in FIG. 1 in a case where the disconnection does not occur. FIG. 2 shows the state where first switch elements SW11-5W14 are conductive and first charge drawing circuit 37 draws charge. Second switch elements SW21-SW24 are non-conductive. As a constant current flows through each of first resistors R11-R14, a voltage drop occurs. Since the magnitudes of the constant currents which first current sources I11-I14 draw are substantially equal, voltage drops of first resistors R11-R14 are substantially equal. Accordingly, each of the voltages which first voltage detection circuit 35 detects, is hardly affected by voltage drops of first resistors R11-R14, and substantially equal to each of the voltages of battery cells S1-S3. Namely, the error in detecting the voltages is small.

As the magnitude of the constant current is made larger, the voltage can be changed in a shorter time in the occurrence of the disconnection as mentioned below. However, since the voltage drops of first resistors R11-R14 become larger, the error in detecting the voltages becomes larger. Here, the upper limit value (for example, 4.1V) of the usable voltage in each of battery cells S1-S3, is lower than second detection voltage OV (for example, 4.5V), by a margin voltage. Then, the lower limit value (for example, 3V) of the usable voltage in each of battery cells S1-S3, is higher than first detection voltage UV (for example, 2V), by a margin voltage. Therefore, the magnitude of the constant currents is set such that the maximum value of the error in detecting the voltages becomes smaller than the margin voltage. Thus, it is prevented, that the abnormal detection signal is erroneously detected by the operation of first charge drawing circuit 37 or second charge drawing circuit 38.

The same operation is done also in the state where second charge drawing circuit 38 draws charge. Each of the voltages which second voltage detection circuit 36 detects, is hardly affected by voltage drops of second resistors R21-R24.

When a first condition is satisfied, controlling circuit 34 obtains the voltages detected by first voltage detection circuit 35. It is the first condition, that the voltage of each of battery cells S1-S3 detected by first voltage detection circuit 35 and second voltage detection circuit 36 is higher than predetermined threshold voltage Vth, after first charge drawing circuit 37 and second charge drawing circuit 3 draw charge. When the first condition is satisfied, no disconnection occurs. Then, controlling circuit 34 carries out a normal control, referring to the obtained voltages.

Figure 3:
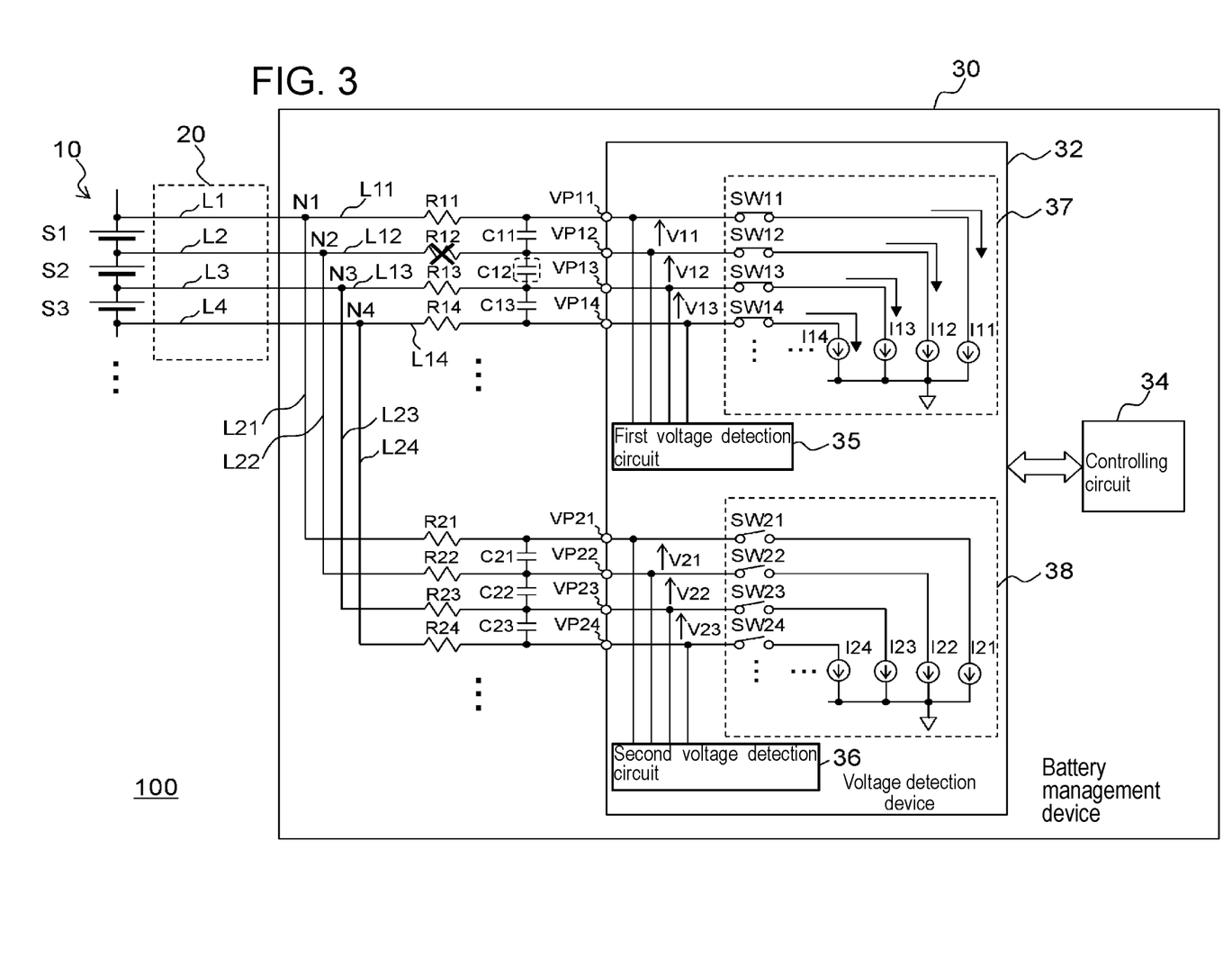
FIG. 3 is a figure illustrating the performance of the power supply device in FIG. 1 in a case where a disconnection at one of first voltage detection lines occurs.

(2) Case 2 where the disconnection occurs in first voltage detection lines L11-L14 FIG. 3 is a figure illustrating the performance of power supply device 100 in FIG. 1 in a case where a disconnection at first voltage detection line L12 occurs. Here, first resistor R12 comes off, and thereby first voltage detection line L12 is disconnected. The voltage of both ends of first capacitance element C11 is voltage V11. The voltage of both ends of first capacitance element C12 is voltage V12. The voltage of both ends of first capacitance element C13 is voltage V13. The voltage of both ends of second capacitance element C21 is voltage V21. The voltage of both ends of second capacitance element C22 is voltage V22. The voltage of both ends of second capacitance element C23 is voltage V23.

Figure 4A:
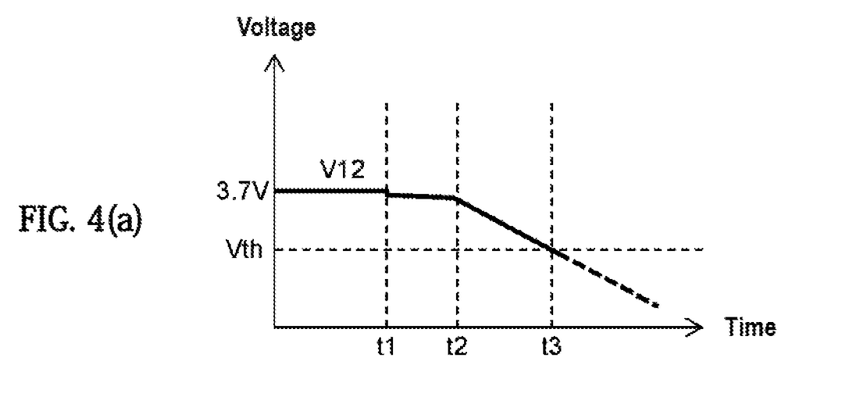
FIG. 4(a) is a graph which shows changes of voltage V12 in FIG. 3.
Figure 4B:
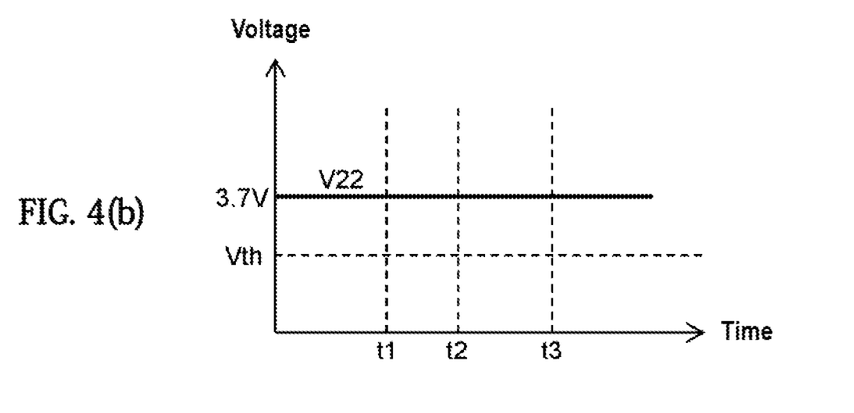
FIG. 4(b) is a graph which shows changes of voltage V22 in FIG. 3.

FIG. 4(a) is a graph which shows changes of voltage V12 in FIG. 3. FIG. 4(b) is a graph which shows changes of voltage V22 in FIG. 3. First voltage detection line L12 is disconnected at time t1, and first switch elements SW11-SW14 become conductive at time t2. Since first voltage detection line L12 is disconnected, the charge of first capacitance element 12 is drawn by the constant current which first constant current source I12 draws. Thereby, as shown in FIG. 4(a), voltage V12 starts to decrease. In contrast, as shown in FIG. 4(b), voltage V22 does not change. Other voltages V21, V23 do not change, not shown in the figures.

Next, voltage V12 reaches threshold voltage Vth at time t3. When a second condition is satisfied, controlling circuit 34 obtains the voltages V21-V23 detected by second voltage detection circuit 36. Controlling circuit 34 notifies the higher rank controller of a first detection signal which indicates that any one of first voltage detection lines L11-L14 is disconnected. It is the second condition, that voltage (V12) of any one of the battery cells detected by first voltage detection circuit 35 is equal to or less than predetermined threshold voltage Vth after first charge drawing circuit 37 draws charge, and voltages V21-V23 of the battery cells detected by second voltage detection circuit 36 is higher than predetermined threshold voltage Vth. The first detection signal may include which first voltage detection line is disconnected.

Since voltages V21-V23 detected by second voltage detection circuit 36 are correct voltages, controlling circuit 34 carries out the normal control, referring to the obtained voltages. Further, corresponding to the first detection signal, the higher rank controller can carry out a necessary countermeasure of restricting the amounts of charge and discharge of battery cells S1-S3 or informing a user of a disconnection.

Figure 5:
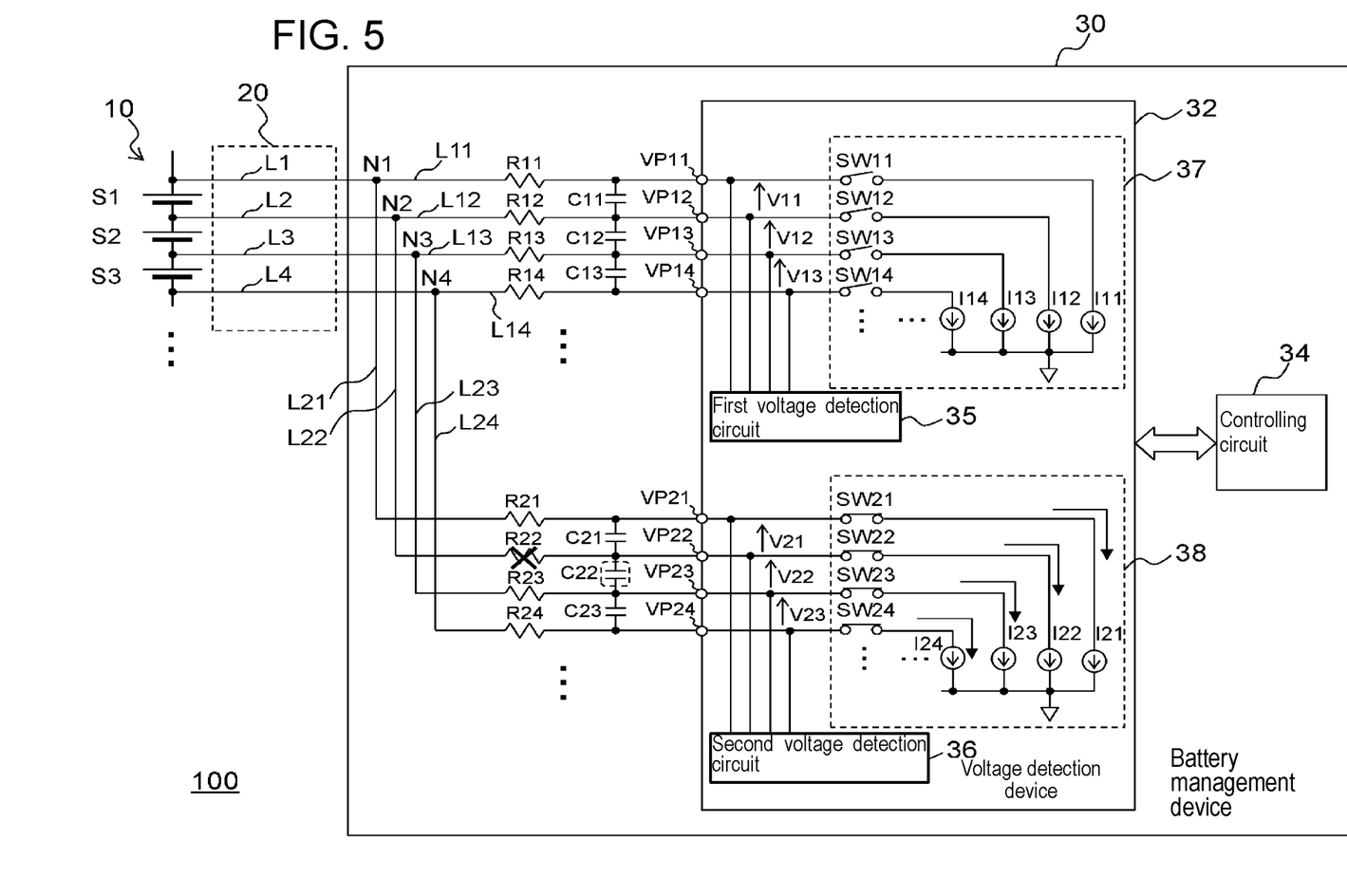
FIG. 5 is a figure illustrating the performance of the power supply device in FIG. 1 in a case where a disconnection at one of second voltage detection lines occurs.

(3) Case 3 where the disconnection occurs in second voltage detection lines L21-L24 FIG. 5 is a figure illustrating the performance of power supply device 100 in FIG. 1 in a case where a disconnection at second voltage detection line L22 occurs. Here, second resistor R22 comes off, and thereby second voltage detection line L22 is disconnected.

Figure 6A:
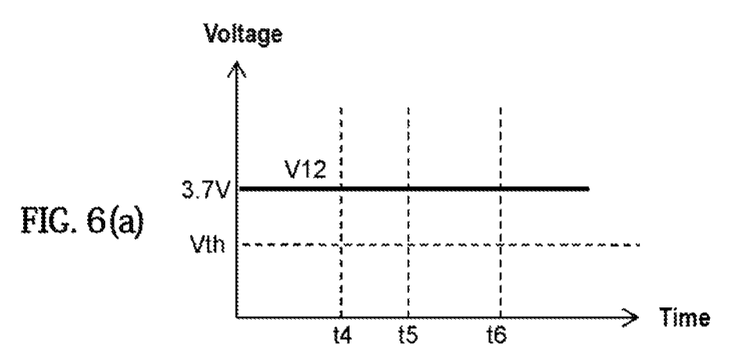
FIG. 6(a) is a graph which shows changes of voltage V12 in FIG. 5.
Figure 6B:
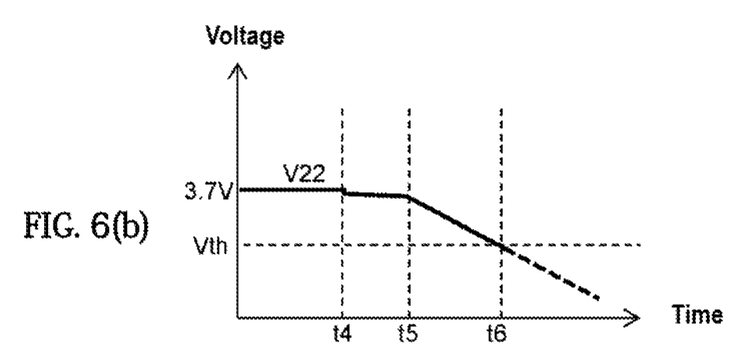
FIG. 6(b) is a graph which shows changes of voltage V22 in FIG. 5.

FIG. 6(a) is a graph which shows changes of voltage V12 in FIG. 5. FIG. 6(b) is a graph which shows changes of voltage V22 in FIG. 5. Second voltage detection line L22 is disconnected at time t4, and second switch elements SW21-SW24 become conductive at time t5. Since second voltage detection line L22 is disconnected, the charge of second capacitance element 22 is drawn by the constant current which second constant current source 122 draws. Thereby, as shown in FIG. 6(b), voltage V22 starts to decrease. In contrast, as shown in FIG. 6(a), voltage V12 does not change. Other voltages V11, V do not change, not shown in the figures.

Next, voltage V22 reaches threshold voltage Vth at time t6. When a third condition is satisfied, controlling circuit 34 obtains the voltages V11-V13 detected by first voltage detection circuit 35. Controlling circuit 34 notifies the higher rank controller of a second detection signal which indicates that any one of second voltage detection lines L21-L24 is disconnected. It is the third condition, that voltage (V22) of any one of the battery cells detected by second voltage detection circuit 36 is equal to or less than predetermined threshold voltage Vth after second charge drawing circuit 38 draws charge, and voltages V11-V13 of the battery cells detected by first voltage detection circuit 35 is higher than predetermined threshold voltage Vth. The second detection signal may include which second voltage detection line is disconnected.

Since voltages V11-V13 detected by first voltage detection circuit 35 are correct voltages, controlling circuit 34 carries out the normal control, referring to the obtained voltages. Further, corresponding to the second detection signal, the higher rank controller can carry out the above-mentioned necessary countermeasure.

Figure 7:
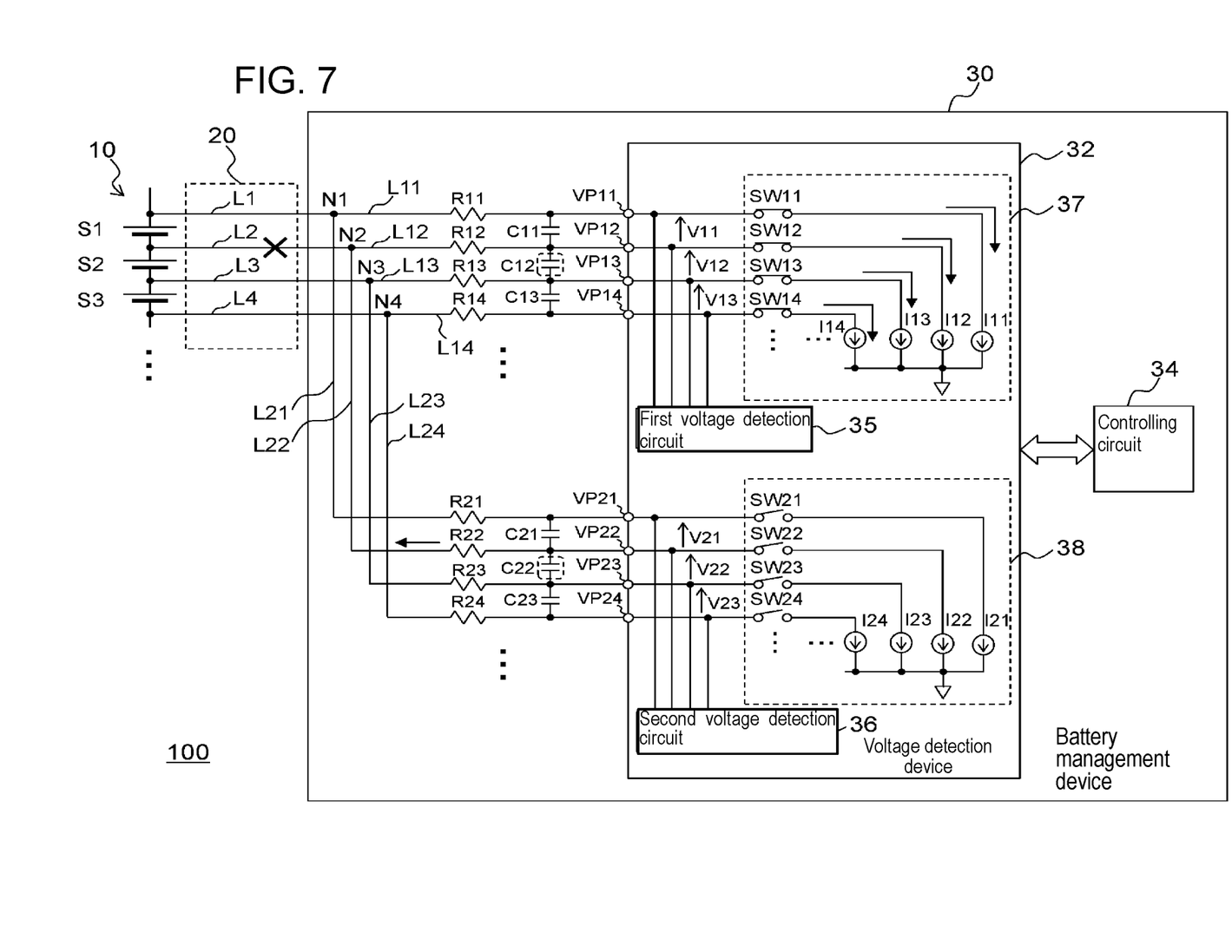
FIG. 7 is a figure illustrating the performance of the power supply device in FIG. 1 in a case where a disconnection at one of common voltage detection lines occurs.
Figure 8A:
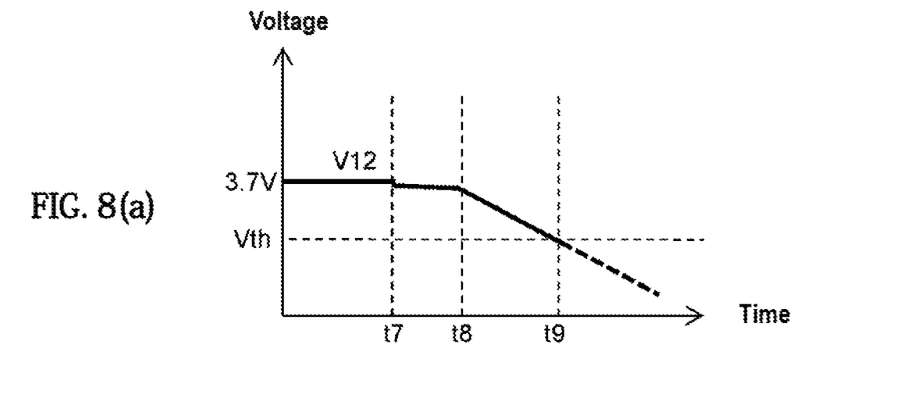
FIG. 8(a) is a graph which shows changes of voltage V12 in FIG. 7.
Figure 8B:
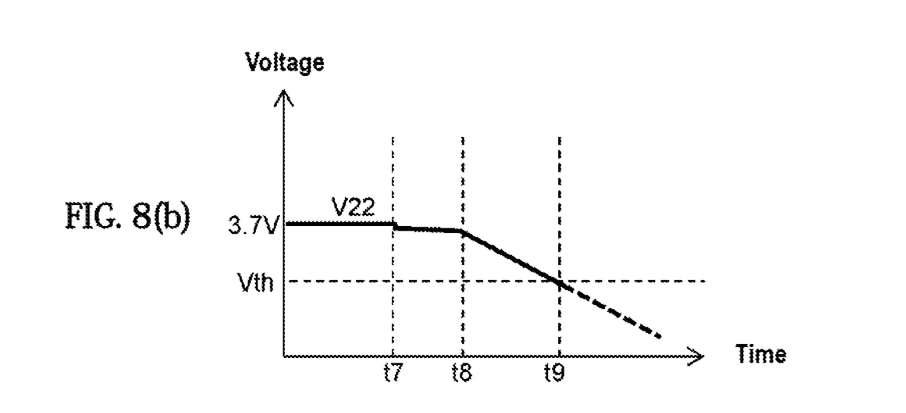
FIG. 8(b) is a graph which shows changes of voltage V22 in FIG. 7.

(4) Case 4 where the disconnection occurs in common voltage detection lines L1-L4 FIG. 7 is a figure illustrating the performance of power supply device 100 in FIG. 1 in a case where a disconnection at common voltage detection line L2 occurs. FIG. 8(a) is a graph which shows changes of voltage V12 in FIG. 7. FIG. 8(b) is a graph which shows changes of voltage V22 in FIG. 7. Common voltage detection line L2 is disconnected at time t7, and first switch elements SW11-SW14 become conductive at time t8. Since common voltage detection line L2 is disconnected, the charge of first capacitance element 12 is drawn by the constant current which first constant current source 112 draws. Also, the charge of second capacitance element 22 is drawn, via first voltage detection line L12 and second voltage detection line L22. Thereby, as shown in FIG. 8(a), voltage V12 starts to decrease. Also, as shown in FIG. 8(b), voltage V22 starts to decrease.

Next, voltage V12 and voltage V22 reach threshold voltage Vth at time t9. When a third condition is satisfied, controlling circuit 34 notifies the higher rank controller of a third detection signal which indicates that any one of common voltage detection lines L1-L4 is disconnected. It is the fourth condition, that the voltage of any one of the battery cells detected by first voltage detection circuit 35 is equal to or less than predetermined threshold voltage Vth after first charge drawing circuit 37 and second charge drawing circuit 38 draw charge, and the voltage of any one of the battery cells detected by second voltage detection circuit 36 is equal to or less than predetermined threshold voltage Vth. The third detection signal may include which common voltage detection line is disconnected.

voltage detection device 32 cannot detect the voltages of battery cells S1, S2 connected to common voltage detection line L2. Therefore, corresponding to the third detection signal, the higher rank controller can carry out a necessary countermeasure of stopping charge and discharge of battery cells S1-53 and also informing a user of a disconnection.

As explained above, according to this exemplary embodiment, when any one of first voltage detection lines L11-L14 is disconnected, the charge is drawn by first charge drawing circuit 37, from the first capacitance element whose higher potential side is connected to the disconnected first voltage detection line. Thereby, the voltage between both ends of this first capacitance element decreases. Therefore, the disconnection of the first voltage detection line can be detected.

Further, when any one of second voltage detection lines L21-L24 is disconnected, the charge is drawn by second charge drawing circuit 38, from the second capacitance element whose higher potential side is connected to the disconnected second voltage detection line. Thereby, the voltage between both ends of this second capacitance element decreases. Therefore, the disconnection of the second voltage detection line can be detected.

Therefore, controlling charge and discharge of battery cells S1-53 can be carried out, by using the voltages detected by first voltage detection circuit 35 connected to non-disconnected first voltage detection lines L11-L14 and second voltage detection circuit 36 connected to non-disconnected second voltage detection lines L21-L24. Therefore, even though the disconnection occurs, controlling charge and discharge is not stopped immediately, an d the vehicle can be stopped. Accordingly, the convenience of the user can be enhanced.

Further, when any one of common voltage detection lines L1-L4 is disconnected, the charges are drawn by second charge drawing circuit 38, from the first and second capacitance elements whose higher potential sides are connected to the disconnected common voltage detection line. Thereby, the voltage between both ends of each of these first and second capacitance elements decreases. Therefore, the disconnection of the common voltage detection line can be detected.

Thus, it is capable to specify the location of the disconnection. Thereby, depending on the location of the disconnection, the necessary countermeasure can be appropriately carried out.

Second Exemplary Embodiment

The second charge drawing circuit in the second exemplary embodiment is configured of using switching elements for a cell balance. So, this configuration of the second exemplary is different from the first exemplary embodiment The points different from the first exemplary embodiment will be explained below.

Figure 9:
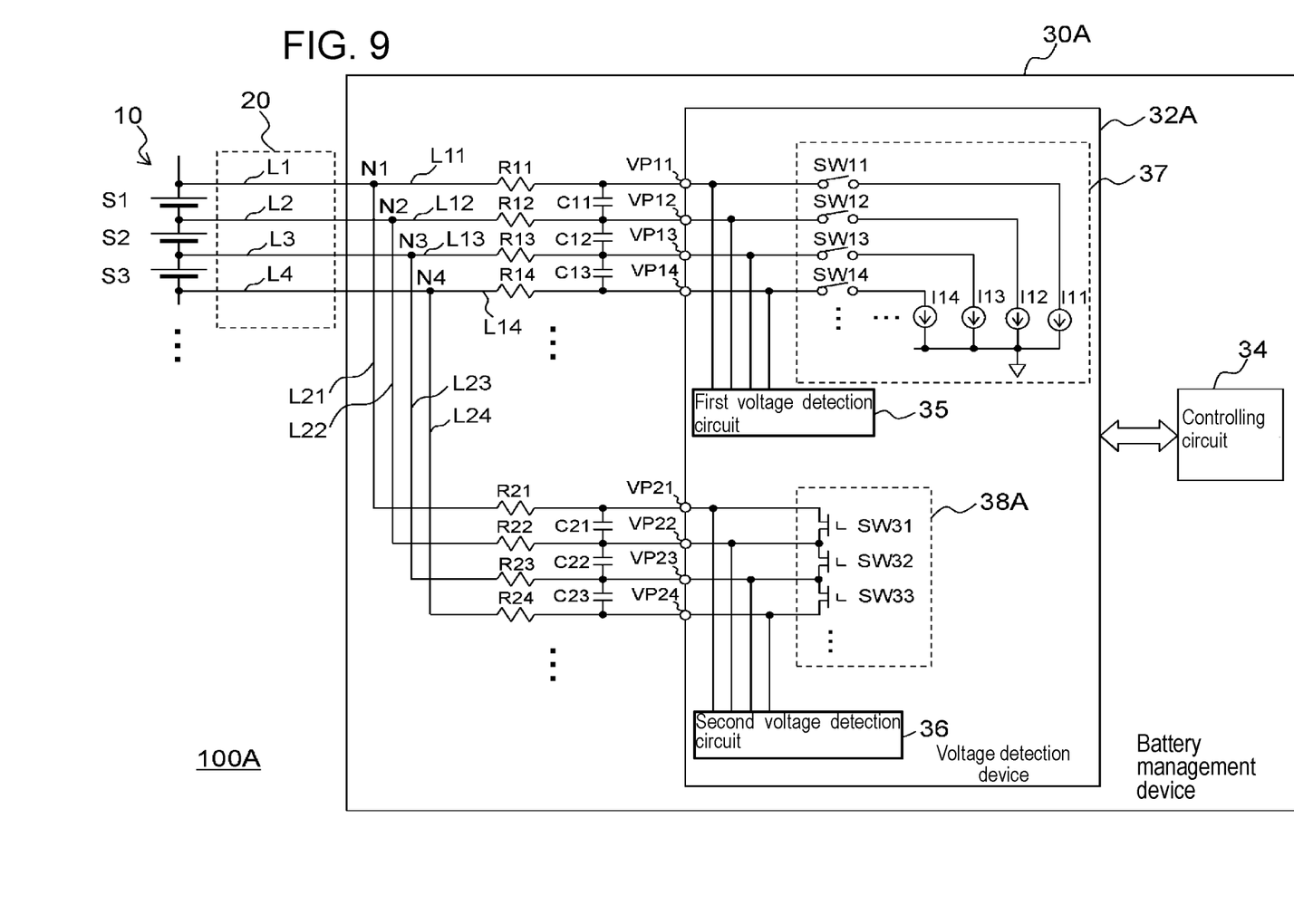
FIG. 9 is a circuit diagram showing a power supply device according to a second exemplary embodiment of the present invention.

FIG. 9 is a circuit diagram showing a configuration of power supply device 100A relating to the second first exemplary embodiment. Second charge drawing circuit 38A includes a plurality of second switching elements SW31-SW33 which are each connected between the two second voltage detection lines connected to each of battery cells S1-S3. Concretely, second switch element SW31 is connected between second voltage input terminal VP21 and second voltage input terminal VP22. Second switch element SW32 is connected between second voltage input terminal VP22 and second voltage input terminal VP23. Second switch element SW33 is connected between second voltage input terminal VP23 and second voltage input terminal VP24. Second switch elements SW31-SW33 are, for example, n-type MOS transistors.

Second switch elements SW31-SW33 are also used for switching elements for the cell balance.

In order to detect the disconnection, controlling circuit 34 makes second switch elements SW31-SW33 conductive, and subsequently makes second switch elements SW31-SW33 non-conductive. Then, controlling circuit 34 determines whether or not the voltage of any one of the battery cells detected by second voltage detection circuit 36 is equal to or less than predetermined threshold voltage Vth.

In the same way as the first exemplary embodiment, for example, when second common voltage detection line L22 is disconnected, the charge of second capacitance element 22 is drawn by second switch element SW32 made conductive. Thereby, the voltage between both ends of second capacitance element C22 decreases.

Preferably, controlling circuit 34 makes every other second switch elements SW31, SW33 conductive, and subsequently makes every other second switch elements SW31, SW33 non-conductive. Next, controlling circuit 34 makes remaining every other second switch element SW32 conductive, and subsequently makes remaining every other second switch element SW32 non-conductive.

According to this exemplary embodiment, as the charges are drawn by second switch elements SW31-SW33 for the cell balance, it is not necessary that second charge drawing circuit 38A is provided with current sources. Therefore, compared with the first exemplary embodiment, the number of current sources can be reduced to a half. Accordingly, voltage detection device 32A can be downsized.

Here, in the same way as second charge drawing circuit 38A, second charge drawing circuit 37 may include a plurality of switching elements which are each connected between the two first voltage detection lines connected to each of battery cells S1-S3, without current sources. In this configuration, when the size of each of the current sources is comparatively large, voltage detection device 32A can be downsized.

Third Exemplary Embodiment

Voltage detection device 32 of the first exemplary embodiment is provided as one semiconductor integrated circuit. However, in the second exemplary embodiment, the voltage detection device is divided into two pieces of semiconductor integrated circuits. The points different from the first exemplary embodiment will be explained below.

Figure 10:
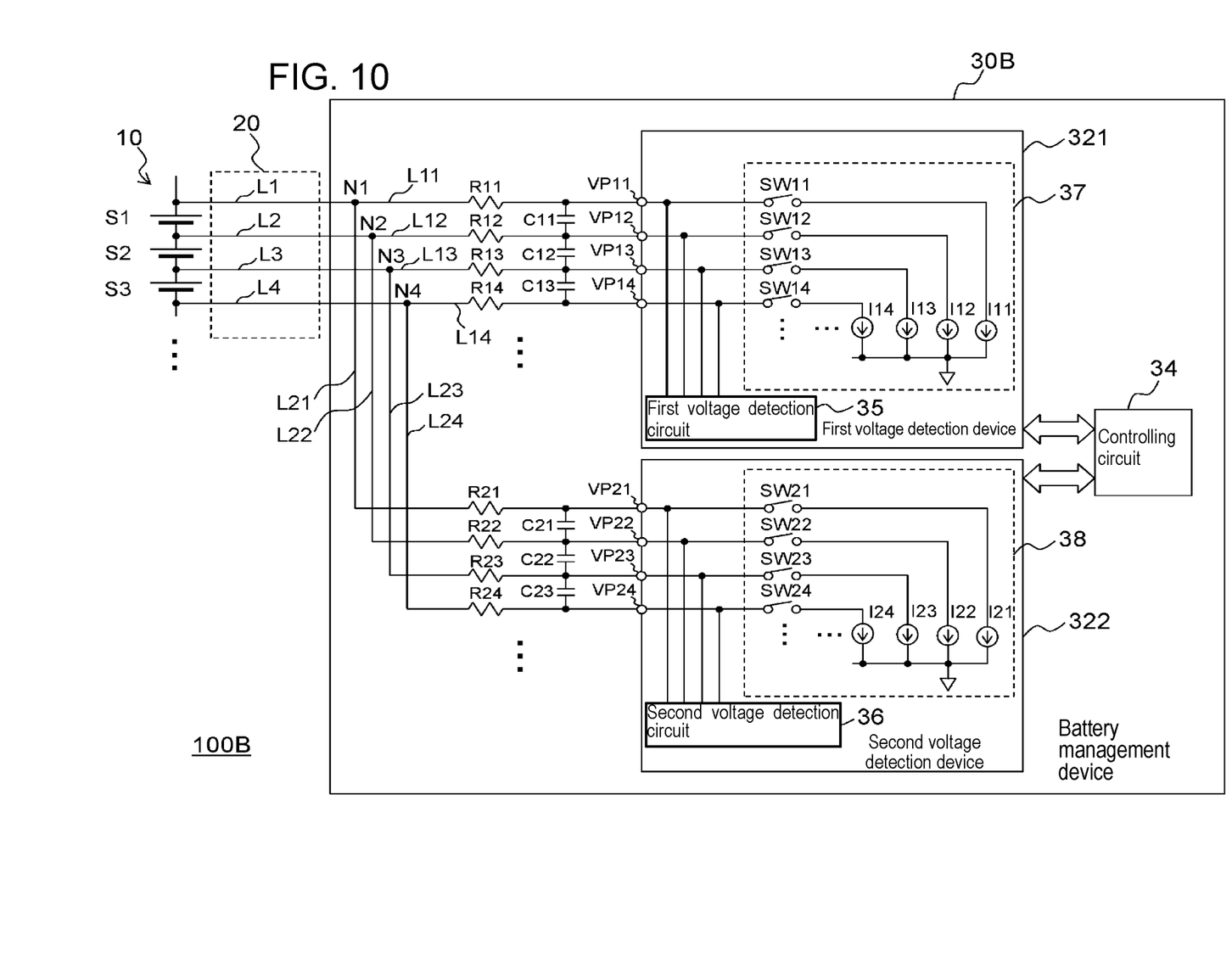
FIG. 10 is a circuit diagram showing a power supply device according to a third exemplary embodiment of the present invention.

FIG. 10 is a circuit diagram showing a configuration of power supply device 100B relating to the third exemplary embodiment. As shown in FIG. 10, first voltage detection device 321, that is, first voltage detection circuit 35 and first charge drawing circuit 37 are provided as a first semiconductor integrated circuit. Second voltage detection device 322, that is, second voltage detection circuit 36 and second charge drawing circuit 38 are provided as a second semiconductor integrated circuit. First voltage detection device 321 is the same circuit as second voltage detection device 322.

According to this exemplary embodiment, battery management device 30B is configured of two pieces of the same semiconductor integrated circuits.

The present invention has been described based on the exemplary embodiments. A person of the ordinary skill in the art can understand that the exemplary embodiment is illustrative only, constitution elements and combined processes can be modified, and such modified examples are covered by the scope of the present invention.

In the above-mentioned exemplary embodiment, battery management device 30 is used for managing the secondary batteries for the vehicle. Battery management device 30 can be also used for managing power storage modules in a stationary power storage system. Additionally, capacitors, such as electric double layer capacitors can be used as battery cells S1-S4.

The exemplary embodiment may be specified by items described below.

Item 1

A management device (30, 30A, 30B) includes:
a first voltage detection circuit (35) which is connected by first voltage detection lines (L11-L14) to each node in a plurality of cells (S1-S3) connected in series and detects the voltage of each of the plurality of cells (S1-S3);
a second voltage detection circuit (36) which is connected, by second voltage detection lines (L21-L24), to each node in the plurality of cells (S1-S3) and detects the voltage of each of the plurality of cells (S1-S3);
first capacitance elements (C11-C13) which are each connected between the two first voltage detection lines (L11 and L12, L12 and L13, L13 and L14) connected to each cell (S1-S3);
second capacitance elements (C21-C23) which are each connected between the two second voltage detection lines (L21 and L22, L22 and L23, L23 and L24) connected to each cell (S1-S3);
a first charge drawing circuit (37) which draws charge from each node in the plurality of cells (S1-S3), via each first voltage detection line (L11-L14); and
a second charge drawing circuit (38, 38A) which draws charge from each node in the plurality of cells (S1-S3), via each second voltage detection line (L21-L24).

Accordingly, it is capable to specify the location of the disconnection as well as to detect the occurrence of the disconnection.

Item 2

The management device (30, 30A, 30B) according to item 1, includes a controlling circuit (34) which makes the first charge drawing circuit (37) and the second drawing circuit (38, 38A) alternatively draw the charge.

Accordingly, a determination is always made as to whether or not the disconnection occurs, while suppressing an increase of power consumption.

Item 3

In the management device (30, 30A, 30B) according to item 2,
the controlling circuit (34) obtains the voltages detected by the first detection circuit (35),
when
the voltage of any one of the battery cells (S1-S3) detected by the first voltage detection circuit (35) is equal to or less than a predetermined threshold voltage after the first charge drawing circuit (37) draws charge and
the voltages of the battery cells (S1-S3) detected by the second voltage detection circuit (36) is higher than the predetermined threshold voltage,
or,
the controlling circuit (34) obtains the voltages detected by the second detection circuit (36),
when
the voltage of any one of the battery cells (S1-S3) detected by the second voltage detection circuit (36) is equal to or less than the predetermined threshold voltage after the second charge drawing circuit (38, 38A) draws charge and the voltages of the battery cells (S1-S3) detected by the first voltage detection circuit (35) is higher than the predetermined threshold voltage.

Accordingly, controlling charge and discharge of battery cells (S1-S3) can be carried out, by using the voltages detected through the non-disconnected first voltage detection lines (L11-L14) or the non-disconnected second voltage detection lines (L21-L24).

Item 4

In the management device (30, 30A, 30B) according to item 2 or 3,
the controlling circuit (34) outputs a signal which indicates that any one of the second voltage detection lines (L21-L24) or the second voltage detection lines (L21-L24) is disconnected,
when
the voltage of any one of the battery cells (S1-S3) detected by the first voltage detection circuit (35) is equal to or less than a predetermined threshold voltage after the first charge drawing circuit (37) draws charge and
the voltages of the battery cells (S1-S3) detected by the second voltage detection circuit (36) is higher than the predetermined threshold voltage,
or,
when
the voltage of any one of the battery cells (S1-S3) detected by the second voltage detection circuit (36) is equal to or less than the predetermined threshold voltage after the second charge drawing circuit (38, 38A) draws charge and
the voltages of the battery cells (S1-S3) detected by the first voltage detection circuit (35) is higher than the predetermined threshold voltage.

Accordingly, the signal is outputted which indicates that any one of the second voltage detection lines (L21-L24) or the second voltage detection lines (L21-L24) is disconnected, a necessary countermeasure of restricting the amounts of charge and discharge of battery cells (S1-S3) or informing a user of the disconnection, can be carried out.

Item 5

In the management device (30, 30A, 30B) according to any one of items 2 to 4,
the first voltage detection lines (L11-L14) and the second voltage detection lines (L21-L24) are connected to the nodes in the plurality of battery cells (S1-S3), by common detection lines (L1-L4),
the controlling circuit (34) outputs a signal which indicates that any one of the common detection lines (L1-L4) is disconnected,
when
the voltage of any one of the battery cells (S1-S3) detected by the first voltage detection circuit (35) is equal to or less than a predetermined threshold voltage after the first charge drawing circuit (37) or the second charge drawing circuit (38, 38A) draws charge and
any one of the voltages of the battery cells (S1-S3) detected by the second voltage detection circuit (36) is equal to or less than the predetermined threshold voltage.

Accordingly, the signal is outputted which indicates that any one of the common detection lines (L1-L4) is disconnected, a necessary countermeasure of stopping charge and discharge of battery cells (S1-S3) or informing a user of the disconnection, can be carried out.

Item 6

In the management device according to any one of items 1 to 5,
the first charge drawing circuit (37) includes:
a plurality of first switch elements (SW11-SW14) which each have one end connected to the corresponding one of the first voltage detection lines (L11-L14); and
a plurality of first current sources (I11-I14) which each have one end connected to the other end of the corresponding one of the first switch elements (SW11-SW14) and the other end connected to a predetermined fixed potential,
the second charge drawing circuit (38) includes:
a plurality of second switch elements (SW21-SW24) which each have one end connected to the corresponding one of the second voltage detection lines (L21-L24); and
a plurality of second current sources (I21-I24) which each have one end connected to the other end of the corresponding one of the second switch elements (SW21-SW24) and the other end connected to the fixed potential.

According to this, the first charge drawing circuit (37) and the second charge drawing circuit (38) can be realized with a simple configuration.

Item 7

In the management device according to any one of items 1 to 5,
the first charge drawing circuit (37) includes:
a plurality of first switch elements (SW11-SW14) which each have one end connected to the corresponding one of the first voltage detection lines (L11-L14); and a plurality of first current sources (111-114) which each have one end connected to the other end of the corresponding one of the first switch elements (SW11-SW14) and the other end connected to a predetermined fixed potential, the second charge drawing circuit (38A) includes a plurality of second switching elements (SW31-SW33) which are each connected between the two second voltage detection lines (L21 and L22, L22 and L23, L23 and L24) connected to each of the cells (S1-S3).

Accordingly, as the charges are drawn by the second switch elements (SW31-SW33) for the cell balance, it is not necessary that the second charge drawing circuit (38A) is provided with current sources for drawing charges. Therefore, the number of current sources can be reduced.

Item 8

In the management device according to any one of items 1 to 6, the first voltage detection circuit (35) and the first charge drawing circuit (37) are provided as a first semiconductor integrated circuit (321), and the second voltage detection circuit (36) and the second charge drawing circuit (38) are provided as a second semiconductor integrated circuit (322).

Accordingly, the management device can be configured of two pieces of the same semiconductor integrated circuits.

Item 9

A power supply device (100, 100A, 100B) includes:
a power storage module (10) in which the plurality of cells (S1-S3) are connected in series; and
the management device (30, 30A, 30B) according to any one of items 1 to 8 to manage the power storage module (10).

Reference Marks in the Drawings

The invention claimed is:

1. A management device comprising:
a first voltage detection circuit which is connected by first voltage detection lines to each node in a plurality of cells connected in series and detects the voltage of each of the plurality of cells;
a second voltage detection circuit which is connected, by second voltage detection lines, to each node in the plurality of cells and detects the voltage of each of the plurality of cells;
first capacitance elements which are each connected between the two first voltage detection lines connected to each cell;
second capacitance elements which are each connected between the two second voltage detection lines connected to each cell;
a first charge drawing circuit which draws charge from each node in the plurality of cells, via each first voltage detection line;
a second charge drawing circuit which draws charge from each node in the plurality of cells, via each second voltage detection line;
a controlling circuit which makes the first charge drawing circuit and the second drawing circuit alternatively draw the charge,
the controlling circuit outputs a first signal which indicates that any one of the first voltage detection lines, when the voltage of any one of the battery cells detected by the first voltage detection circuit is equal to or less than a predetermined threshold voltage after the first charge drawing circuit draws charge and the voltages of the battery cells detected by the second voltage detection circuit is higher than the predetermined threshold voltage, or, the controlling circuit outputs a second signal which indicates that any one of the second voltage detection lines is disconnected, when the voltage of any one of the battery cells detected by the second voltage detection circuit is equal to or less than the predetermined threshold voltage after the second charge drawing circuit draws charge and the voltages of the battery cells detected by the first voltage detection circuit is higher than the predetermined threshold voltage;

the first voltage detection lines and the second voltage detection lines are connected to the each node in the plurality of battery cells, by common detection lines;

the controlling circuit outputs a third signal which indicates that any one of the common detection lines is disconnected, when the voltage of any one of the battery cells detected by the first voltage detection circuit is equal to or less than the predetermined threshold voltage after the first charge drawing circuit or the second charge drawing circuit draws charge, and any one of the voltages of the battery cells detected by the second voltage detection circuit is equal to or less than the predetermined threshold voltage;

the common detection lines are branched into the first voltage detection lines and the second voltage detection lines; and the controlling circuit distinguishably detects a disconnection of the first voltage detection lines and the second voltage detection lines and the common detection lines.

2. The management device according to claim 1,
the controlling circuit obtains the voltages detected by the first detection circuit, when the voltage of any one of the battery cells detected by the first voltage detection circuit is equal to or less than the predetermined threshold voltage after the first charge drawing circuit draws charge and
the voltages of the battery cells detected by the second voltage detection circuit is higher than the predetermined threshold voltage, or, the controlling circuit obtains the voltages detected by the second detection circuit,
when the voltage of any one of the battery cells detected by the second voltage detection circuit is equal to or less than the predetermined threshold voltage after the second charge drawing circuit draws charge and
the voltages of the battery cells detected by the first voltage detection circuit is higher than the predetermined threshold voltage.

3. The management device according to claim 2, wherein,
the first charge drawing circuit includes:
a plurality of first switch elements which each have one end connected to the corresponding one of the first voltage detection lines; and
a plurality of first current sources which each have one end connected to the other end of the corresponding one of the first switch elements and the other end connected to a predetermined fixed potential, the second charge drawing circuit includes:

a plurality of second switch elements which each have one end connected to the corresponding one of the second voltage detection lines; and a plurality of second current sources which each have one end connected to the other end of the corresponding one of the second switch elements and the other end connected to the fixed potential.

4. The management device according to claim 1, wherein, the first charge drawing circuit includes:

a plurality of first switch elements which each have one end connected to the corresponding one of the first voltage detection lines; and a plurality of first current sources which each have one end connected to the other end of the corresponding one of the first switch elements and the other end connected to a predetermined fixed potential, the second charge drawing circuit includes:

a plurality of second switch elements which each have one end connected to the corresponding one of the second voltage detection lines; and a plurality of second current sources which each have one end connected to the other end of the corresponding one of the second switch elements and the other end connected to the fixed potential.

5. The management device according to claim 1, wherein, the first charge drawing circuit includes:

a plurality of first switch elements which each have one end connected to the corresponding one of the first voltage detection lines; and a plurality of current sources which each have one end connected to the corresponding one of the first switch elements and the other end connected to a predetermined fixed potential, the second charge drawing circuit includes a plurality of second switching elements which are each connected between the two second voltage detection lines connected to each cell.

6. The management device according to claim 1, wherein, the first voltage detection circuit and the first charge drawing circuit are provided as a first semiconductor integrated circuit, and the second voltage detection circuit and the second charge drawing circuit are provided as a second semiconductor integrated circuit.

7. A power supply device comprising:

a power storage module in which a plurality of cells are connected in series; and the management device according to claim 1, which manages the power storage module.

8. The management device according to claim 1, wherein, the first charge drawing circuit includes:

a plurality of first switch elements which each have one end connected to the corresponding one of the first voltage detection lines; and a plurality of first current sources which each have one end connected to the other end of the corresponding one of the first switch elements and the other end connected to a predetermined fixed potential, the second charge drawing circuit includes:

a plurality of second switch elements which each have one end connected to the corresponding one of the second voltage detection lines; and a plurality of second current sources which each have one end connected to the other end of the corresponding one of the second switch elements and the other end connected to the fixed potential.

9. The management device according to claim 1, wherein the first charge drawing circuit includes a plurality of first switch elements and a plurality of first current sources, each of the first current sources is connected to a correspond one of the first switch elements, the second charge drawing circuit includes a plurality of second switch elements and a plurality of second current sources, each of the second current sources is connected to a correspond one of the second switch elements, wherein magnitudes of constant currents which the first current sources and the second current sources draw, are respectively, substantially equal.

* * * * *